United States Patent [19]

Rogers

[11] Patent Number: 4,944,571
[45] Date of Patent: Jul. 31, 1990

[54] OPTICAL FIBERS

[75] Inventor: Alan J. Rogers, Bookham, England

[73] Assignee: National Research Development Corporation, London, England

[21] Appl. No.: 97,826

[22] Filed: Sep. 17, 1987

[30] Foreign Application Priority Data

Sep. 19, 1986 [GB] United Kingdom ............... 8622609

[51] Int. Cl.$^5$ ............................ G02B 6/02; G02B 6/16
[52] U.S. Cl. .................................................. 350/96.29
[58] Field of Search ................. 350/96.29, 96.30, 96.33

[56] References Cited

PUBLICATIONS

Howard et al.; "Interaction of High-Frequency Sound With Fibre-Guided Coherent Light"; *Electronics Letters;* vol. 14, No. 19; 1978; pp. 620, 621.

Kino et al.; "Acoustic Modulators for Optical Fibres"; *Revue Phys. Appl.;* vol. 201 1985; pp. 333–340.

*Primary Examiner*—William L. Sikes
*Assistant Examiner*—Robert E. Wise
*Attorney, Agent, or Firm*—Cushman, Darby & Cushman

[57] ABSTRACT

Simultaneous time-variable and position-variable control of the polarization properties from any position along the length of an optical fibre, is effected by launching an acoustic disturbance into the fibre, thereby locally modifying the birefringence of the fibre. A current measurement device incorporating a monomode optical fiber 1 may be made insensitive to vibration by launching an acoustic wave from one end of the fiber. This wave 7 consists of two linearly polarized shear waves orthogonal in direction, and in phase quadrature is of such an amplitude and frequency as to provide a circular birefringence very much greater than the vibrationally-induced linear birefringence.

6 Claims, 1 Drawing Sheet

OPTICAL FIBERS

BACKGROUND OF THE INVENTION

1. Field of the Invention

This invention relates to optical fibres, and in particular, to the control of the optical polarisation properties of optical fibres by propagation of acoustic waves therein.

2. Description of the Related Art

The propagation of electromagnetic radiation in optical fibres is well understood, and has particular applications in the areas of communications and measurement sensing. Information may be conveyed along the fibre by modulating the light in one of several ways: the modulation may be in the form of a variation in the amplitude, phase, frequency or polarisation state of the propagating light. If the modulation is performed at one end of the fibre and is detected and demodulated at the other end, the fibre may be used as a communications medium; if the modulation is effected by means of a field external to the fibre while the light is propagating within it, the emergent light may be detected and demodulated to allow measurement of the external field, and the fibre then comprises a measurement sensor.

It is frequently desirable to control the polarisation properties of optical fibres. In communications this may be either to limit the effects of polarisation dispersion or to increase the efficiency of coherent detection. More often, the control is required for measurement sensors, since the polarisation properties of, especially, monomode optical fibres are very sensitive to external influences, and thus feature strongly in measurement functions.

Static control of polarisation properties is provided by fabricating fibres with special geometries or special strain distributions. The present invention provides the means for simultaneous time-variable and position-variable control of the polarisation properties from any position along the length of the fibre, which may be conveniently one or other of the two ends.

SUMMARY OF THE INVENTION

According to the present invention there is provided apparatus incorporating an optical fibre having coupled thereto means for launching an acoustic disturbance into said fibre.

The disturbance may take the form of waves which have a predetermined amplitude, frequency, phase and polarisation state and which propagate along the fibre. The acoustic waves will modify the optical polarisation properties of the fibre, as they propagate, via the elasto-optic effect. For example, a linearly polarised acoustic shear wave in the fibre will give rise to an optical linear birefringence which has a value proportional at all points to the local amplitude of the acoustic wave. Two such propagating shear waves, orthogonally polarised and in phase quadrature, will give rise to a circular birefringence in the fibre.

BRIEF DESCRIPTION OF THE DRAWINGS

Two specific embodiments of the invention will now be described, by way of example, with reference to the accompanying drawings in which.

DESCRIPTION OF THE PREFERRED EMBODIMENT

Figure 1:
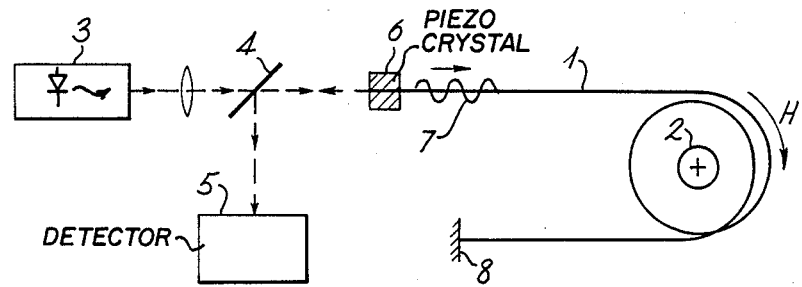
FIG. 1 illustrates an embodiment of the invention incorporating a Faraday-effect optical-fibre current measurement device and FIG. 2 illustrates an embodiment of the invention including a spatially-distributed optical-fibre measurement system.

Referring to FIG. 1, a current measurement device comprises a monomode optical fibre 1 which loops around a current-carrying conductor 2. Linearly polarised light from a light source 3 is launched, via a beamsplitter 4, into the fibre and, as it propagates around the loop, will come under the influence of a longitudinal magnetic field component H due to the current in the conductor. This causes the direction of polarisation to be rotated, due to the Faraday magneto-optic effect. The rotation is proportional to the line integral of the magnetic field around the loop, and thus to the current in the conductor. The rotation of the emergent light is measured by a detector 5 and is used as an indication of the current magnitude. Any vibration present will induce linear birefringence in the fibre, and the effect of this to cause the linearly polarised light in the fibre to become elliptically polarised, the ellipse varying in ellipticity and orientation according to the magnitude and direction of the vibrational stresses. The result of this is a vibrational noise level on the output current indication which severely limits device performance. This problem may be alleviated by launching an acoustic wave from one end of the fibre using, for example, a piezo-electric crystal 6. This wave 7 consists of two linearly polarised shear waves orthogonal in direction, and in phase quadrature. The wave is of such an amplitude and frequency as to provide a circular birefringence very much greater than the vibrationally-induced linear birefringence. The latter is, consequently, rendered ineffective. If the light is reflected back through the fibre to emerge at the launch end using the mirror 8, the net result is a rotation of the optical polarisation direction which depends only on the current in the conductor.

A similar result may also be achieved by using a torsional acoustic wave.

Figure 2:
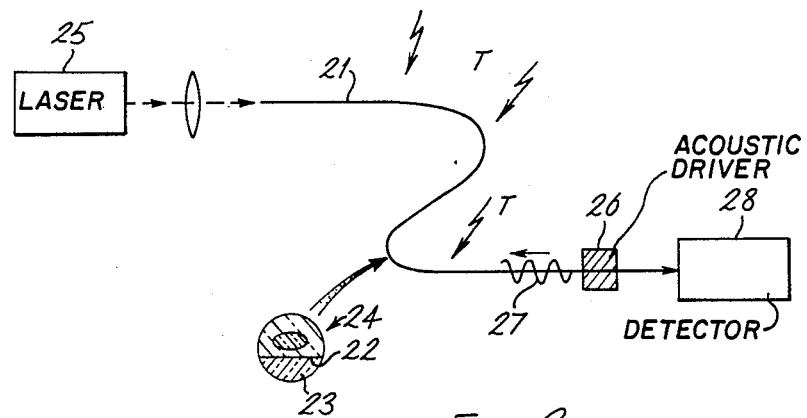

Referring now to FIG. 2, this illustrates a length of monomode 'D' fibre F probing into a temperature field T. The 'D' fibre has high intrinsic (i.e. static) birefringence, and also has the property that propagating light polarised parallel to the flat of the D (i.e. one of the polarisation eigenmodes) has its evanescent field (effectively) wholly within the cladding, whilst the orthogonal linear polarisation (the other eigenmodes) has its evanescent field extending beyond the cladding boundary. The flat 22 of the D may now be coated with a material 23 (shown in fibre cross section 24) which has an optical refractive index strongly dependent on the temperature, in either its real or imaginary part.

Continuous-wave linearly polarised light is launched from a laser 25 at one end of the fibre, into the first of the above eigenmodes. A narrow acoustic pulse is launched from the acoustic driver 26 at a known time into the other end of the fibre. This is a circularly polarised (torsional) pulse 27 which induces a local circular (optical) birefringence equal to $n\pi$ where n is a convenient integer. The length of the pulse must be such as to render $n\pi$ very much greater than the linear birefringence of the fibre over the pulse length. The result is that the propagating light in the non-temperature-dependent polarisation mode is rotated from one mode to the other n times throughout the duration of the pulse. Whilst propagating in the temperature-dependent mode either the velocity (real part) or the amplitude (imaginary part) of the light will be modulated in proportion to the local temperature. A detection of the modulation of the emergent light, by a detector 28, as a function of time this allows the temperature to be measured as a function of position along the length of the fibre, the instantaneous value corresponding to the temperature of the fibre at the (known) instantaneous position of the acoustic pulse. The spatial resolution of the system depends upon the length of the acoustic pulse.

In this way a passive, insulating, distributed sensor is provided without the necessity for optical backscatter techniques or for non-linear optical techniques.

I claim:

1. A spatially-distributed optical-fibre measurement system including a length of monomode 'D' fibre having a flat surface coated with a material which has an optical refractive index strongly dependent on the temperature, a continuous-wave linearly polarised radiation source adapted to launch radiation at one end of the fibre, an acoustic driver adapted to launch an acoustic pulse to induce local circular (optical) birefringence within said fibre and a modulation detector adapted to measure the modulation of the emergent light.

2. Apparatus incorporating an optical fibre as claimed in claim 1 wherein said acoustic driver is positioned adjacent one of the ends of said fibre.

3. Apparatus incorporating an optical fibre as claimed in claim 2 wherein said acoustic driver is a source of torsional acoustic waves.

4. Apparatus incorporating an optical fibre as claimed in claim 1 wherein said acoustic driver is a source of linearly polarised acoustic shear waves.

5. Apparatus incorporating an optical fibre as claimed in claim 4 wherein said acoustic driver is adapted to produce a pair of shear waves, orthogonally polarized and in phase quadrature.

6. A spatially-distributed optical-fibre measurement system comprising a current measurement device including a monomode optical fibre mounted around a current-carrying conductor, a source of linearly polarised radiation, arranged to launch radiation into the fibre, a source of acoustic radiation adapted to launch an acoustic wave into said fibre to induce circular birefringence in said fibre of a magnitude substantially greater than birefringence induced by ambient vibration.

* * * * *